(12) United States Patent
Ishida et al.

(10) Patent No.: US 6,683,358 B1
(45) Date of Patent: Jan. 27, 2004

(54) SILICON INTEGRATED ACCELEROMETER

(75) Inventors: Makoto Ishida, Toyohashi (JP);
Yoshinori Matsumoto, Toyohashi (JP);
Hidekuni Takao, Toyohashi (JP)

(73) Assignee: Asahi Kasei Kabushiki Kaisha, Osaka (JP)

( * ) Notice: Subject to any disclaimer, the term of this patent is extended or adjusted under 35 U.S.C. 154(b) by 0 days.

(21) Appl. No.: 09/554,241
(22) PCT Filed: Nov. 11, 1997
(86) PCT No.: PCT/JP97/04101
§ 371 (c)(1),
(2), (4) Date: May 10, 2000

(51) Int. Cl.[7] ............................................... H01L 29/82
(52) U.S. Cl. ...................... 257/417; 257/254; 257/415; 257/419
(58) Field of Search .................... 257/254, 415, 257/417, 419, 420, 414

(56) References Cited

FOREIGN PATENT DOCUMENTS

| EP | 0 363 005 | 4/1990 |
|---|---|---|
| JP | 2-194343 A | 7/1990 |
| JP | 5-203682 A | 8/1993 |
| JP | 06-207948 A | 7/1994 |
| JP | 6-294812 A | 10/1994 |
| JP | 8-64841 A | 3/1996 |
| JP | 8-75775 A | 3/1996 |
| JP | 8-75776 A | 3/1996 |
| JP | 09-113534 A | 5/1997 |

*Primary Examiner*—George Eckert
*Assistant Examiner*—N. Drew Richards
(74) *Attorney, Agent, or Firm*—Dickstein, Shapiro, Morin & Oshinsky, L.L.P.

(57) ABSTRACT

In an accelerometer, the stress is detected through electric amplification with the use of detecting elements 411–434 having an amplification function arranged on beams 3 and, with the use of a differential amplifier circuits 510 formed on the support base 1, an acceleration component in a detection axis direction to which the stress is applied is outputted as the differential mode and acceleration components in the other axis directions are outputted as the common mode, so that each axis sensitivity ratio between the detection axis sensitivity and the other axis sensitivities is enhanced largely.

9 Claims, 21 Drawing Sheets

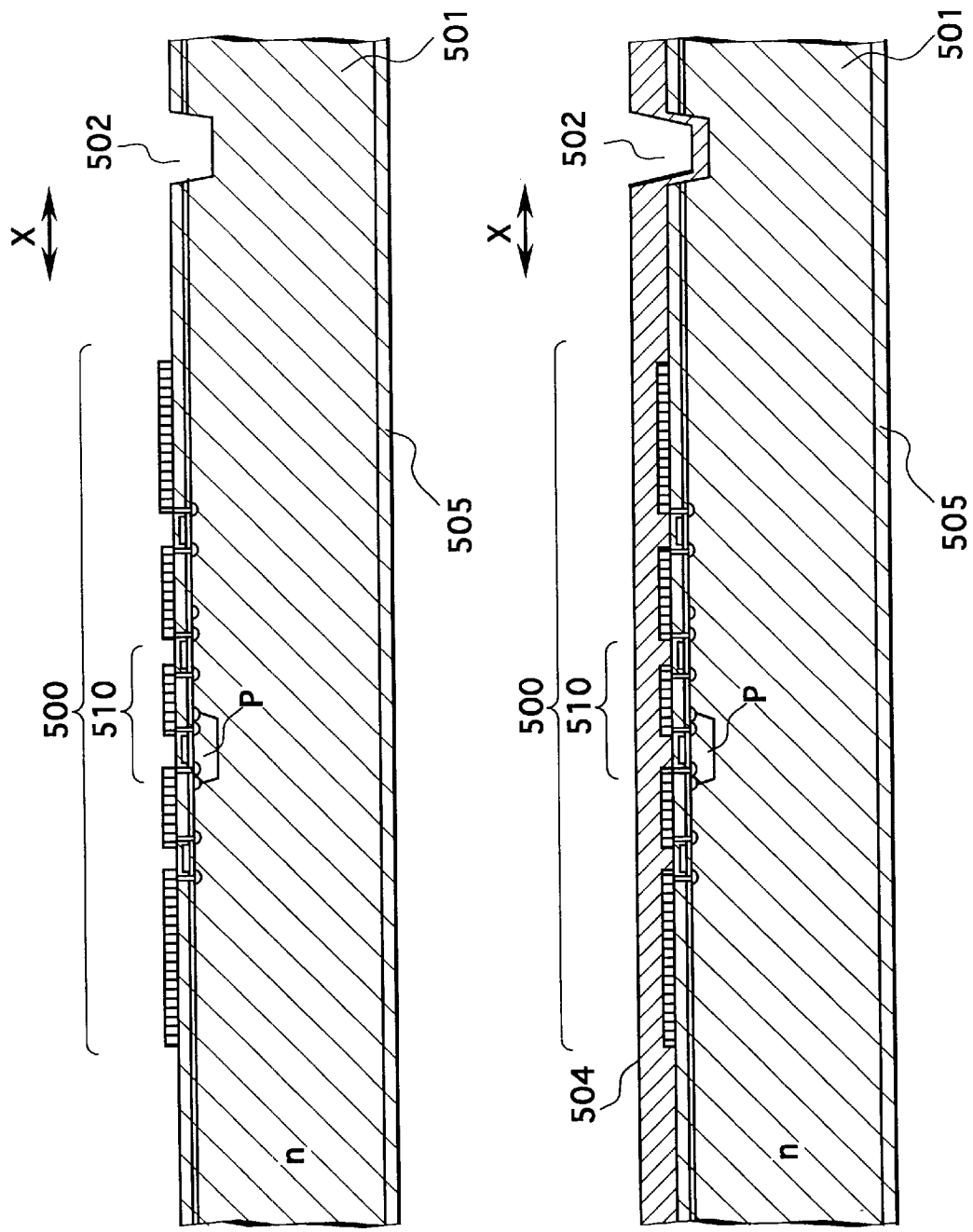

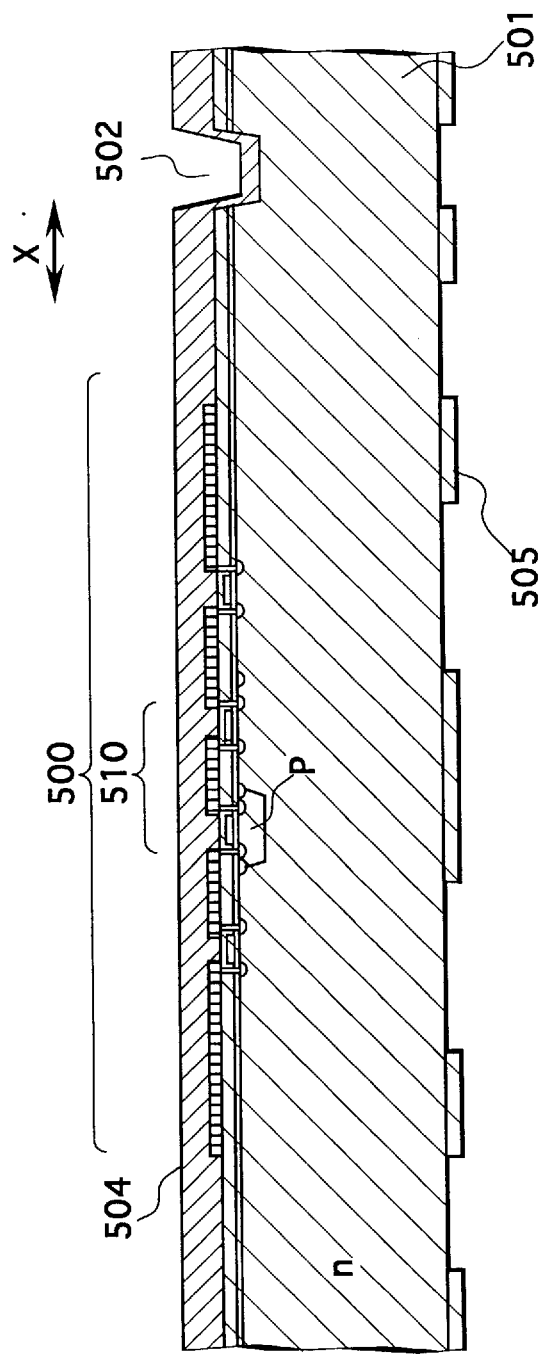
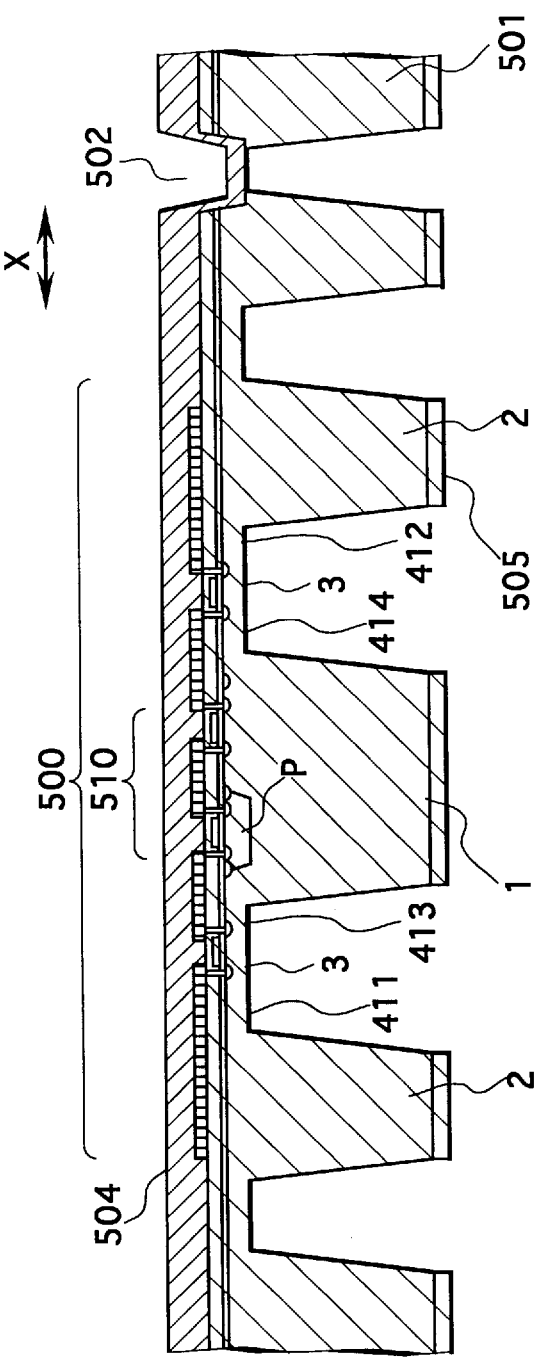
FIG.18C
FIG.18D

SILICON INTEGRATED ACCELEROMETER

FIELD OF THE INVENTION

The present invention relates to an accelerometer for detecting acceleration by bending a beam, especially, relates to a silicon integrated accelerometer wherein a signal processing circuit with sensor elements in a mixed manner is formed on a structure by using micro machine technique, thereby detecting acceleration components in multi-axial directions.

BACKGROUND ART

In recent years, in place of accelerometers capable of detecting the acceleration in only one axis, multi-axial accelerometers capable of detecting the acceleration components in biaxial directions or in triaxial directions have been known (see Japanese Patent Application Laid-open No. 9-113534 (1997) etc.).

First of all, as a first example according to the prior art, a structure of an accelerometer for detecting acceleration components in triaxial directions will be described with reference to FIGS. 1 to 3.

FIG. 1 is a sectional view showing an accelerometer 102 for detecting acceleration components in triaxial directions. This accelerometer 102 has a hollow cylindrical support 104 and a circular silicon substrate 105 bonded on the support 104. A columnar seismic mass 107 consisting of the Pyrex glass is bonded to a center of a bottom surface of the silicon substrate 105.

In the silicon substrate 105, a diaphragm 108 formed into a thin thickness is structured between a peripheral portion 105a bonded to the support 104 and a central portion 105b bonded to the seismic mass 107.

FIG. 2 is a top view showing the accelerometer 102. As the center of the silicon substrate 102 is regarded as the origin, piezo-resistance elements Rx1, Rx2, Rx3, and Rx4 are formed on a top surface of the portion 108, and each two of them positioned in a positive or negative portion on the X axis, respectively.

Samely, piezo-resistance elements Ry1, Ry2, Ry3, and Ry4 are formed on the portion 108, each two of them positioned in a positive or negative portion on the Y axis, respectively. Further, piezo-resistance elements Rz1, Rz2, Rz3, and Rz4 are arranged at position closely adjacent to the piezo-resistance elements Rx1, Rx2, Rx3, and Rx4 in parallel to each of them on the X axis, respectively.

Each group of piezo-resistance elements Rx1–Rx4, piezo-resistance elements Ry1–Ry4, and piezo-resistance elements Rz1–Rz4 composes a bridge circuit, respectively. Before the measurement of the acceleration, each of these three bridge circuits maintains a null balance condition indicating zero output.

As described the above structure, when the acceleration is applied to the accelerometer 102, a stress is applied at the diaphragm 108 by weight of the seismic mass 107, so that the diaphragm 108 is deformed mechanically.

This mechanical deformation causes the change in the resistance of the piezo-resistance elements disposed in the direction to which the stress is applied on the flexible part 108, and the bridge circuit is unbalanced to generate an electric output. Because the resistance of the piezo-resistance elements composing the bridge circuits are changed according to the magnitude and direction of the acceleration, the acceleration components in the three axis (namely, the X, Y, and Z axis) directions can be measured by measuring the changes in the resistance of respective bridge circuits.

FIG. 3 shows an example of a bridge circuit composed of the piezo-resistance elements Rz1–Rz4 for detecting the acceleration component in the Z axis (hereinafter referred to as "Z axis acceleration component"). In FIG. 1, when the acceleration is applied to an upward direction, the piezo-resistance elements Rz1 and Rz4 are applied a negative (minus) stress and the Rz2 and Rz3 are applied a positive (plus) stress. Hence, the bridge circuits induce imbalance, and a potential difference Vab between bridge terminals occurs, thus detecting the Z axis acceleration component.

Furthermore, as a second example according to the prior art, a current detection-type accelerometer having a differential amplifier circuit therein will be described with reference to FIGS. 4A and 4b (see Japanese Patent Application Laid-open No. 6-207948 (1994)).

In FIG. 4A, diffusion layers 151 and 152 having electro-conductivity opposite to that of a semiconductor substrate 150 are formed on the top surface of the semiconductor substrate 150. Moreover, an electrode 153 is provided above the semiconductor substrate 150 with a given separation, being between the diffusion layers 151 and 152. This electrode 153 is defined as a movable electrode of beam structure. In this way, a MIS (Metal Insulator Semiconductor) transistor is structured with the use of air as an insulator film.

Then, by the application of an appropriate voltage on the electrode 153, the inversion layer 154 is formed just below the electrode 153, and the inversion layer 154 conducts electric current between the diffusion layer 151 and the diffusion layer 152, thus flowing a current proportional to a capacitance between the electrode 153 and the semiconductor substrate 150.

Then, if the acceleration is exerted in the X direction perpendicular to the semiconductor substrate 150, the electrode 153 deforms in a direction perpendicular to the substrate surface and the distance between the electrode 153 and the substrate surface changes. As a result, the capacitance changes, and then the amount of current flowing in the inversion layer 154 change, thereby measuring the acceleration proportional to the change in the amount of current.

Further, in FIG. 4B, when a differential amplifier circuit is structured by using two MOS transistors, the acceleration in the X axis effects both of the two MOS transistors 160, 161 equally, so that the amount of currents flowing in the MOS transistors 160, 161 do not have a difference. However, with respect to the displacement of the electrodes in the Z direction, an overlapping width Wa of the MOS transistor 160 and an overlapping width Wb in the MOS transistor 161 are in such a relationship that when the one increases, the other decreases. As a result of this relationship, the currents flowing in the two MOS transistors 160, 161 also vary according to respective overlapping widths Wa, Wb, thus detecting only the acceleration in the Z direction.

In various systems having pressure sensors or accelerometers, miniaturizing the sensors and making these power consumption lower have been in progress. Recently, there is a sensor module in which a peripheral circuit as well as sensor bodies are integrated on a sensor substrate.

In addition, in consideration of the connection of this kind of modules to computers, a sensor equipped with an A/D (analog to digital) conversion function that directly gives a digital output has been developed. As an A/D converter circuit for integrating this kind of sensor, there is a simplified A/D converter in which a plurality of CMOS inverters each of which has a different logic threshold are parallel-connected.

In the first example according to the prior art, as shown in FIG. 1 above, semiconductor diffusion resistance layers as piezo-resistance elements are formed on the flexible part 108 and a bridge circuit is structured by the four piezo-resistance elements, as a unit, thus measuring the acceleration by means of the piezo-resistance effect.

However, in the case of a structure with the use of the semiconductor diffusion resistance layers, there is no function for adjusting the fabrication imbalance in the voltage of an operating point of the bridge circuit and hence offset voltage cannot be reduced sufficiently. Therefore, it is necessary to provide separately a compensation circuit for compensating an offset voltage due to the fabrication imbalance, thus increasing a fabrication cost.

Furthermore, in a configuration with such a bridge circuit, an amplifying function for amplifying a detected signal cannot be provided and hence the output signal level is low. Especially in accelerometers, since the output signal level is low and detection sensitivity is insufficient, a load of an amplifier circuit for amplifying that small output signal becomes heavy, and larger power consumption is required.

Furthermore, when the acceleration is measured by using such a bridge circuit, an adjustment function for adjusting the detection sensitivities according to detected components of the off-axis except a sensitive axis to which the stress is applied is lacking and therefore the accuracy of the measurement is questionable.

On the other hand, in the case of the second example according to the prior art shown in FIG. 4, a capacitance-type structure is employed wherein just beneath the electrode 153 is the air as an insulator film and the acceleration is measured by detecting the current proportional to the change in the capacitance.

However, such a capacitance-type accelerometer has not been made up with the use of piezo-resistance elements and cannot be structured by employing a known CMOS LSI fabrication technology, as it is.

Consequently, there is a problem that its fabrication process becomes complicated and hence an inexpensive sensor cannot be fabricated under maintaining a low-cost for fabrication.

It is also impossible for the offset voltage of a differential circuit to be compensated because the gate electrodes of the two input transistors are common.

In addition, the accelerometer for detecting acceleration components in the triaxial directions has a problem that the compensation of the offset voltages and the improvement of all the S/N ratios according to the triaxial directions cannot be performed at the same time.

DISCLOSURE OF THE INVENTION

An object of the present invention is to provide a silicon integrated accelerometer that has an inexpensive sensor body and has a simplified circuit configuration and is capable of removing the effects of the offset outputs regardless of imbalance in fabrication conditions.

Further, another object of the present invention is to provide a silicon integrated accelerometer capable of improving the measurement accuracy by suppressing sensitivities to off-axis as well as by improving the detection sensitivity to the sensitive axis.

The present invention is a silicon integrated accelerometer comprising a fixed support base, a movable seismic mass, and beams having a thin thickness connecting the support base and the seismic mass, capable of measuring acceleration by using bending of the beams based on a stress, the sensor comprising:

a plurality of strain detecting elements, arranged at stress concentration portions of the beams, for detecting the stress applied in the beams; and differential amplifier circuits, arranged in the support base, for detecting the output values outputted by a plurality of strain detecting elements, wherein the output value according to the sensitive axis acceleration component in a detection axis direction, to which the stress is applied, is detected as a differential mode and the output value according to the other axis components in the other axis directions is detected as a common mode.

In this configuration, a plurality of strain detecting elements are MOS (metal oxide semiconductor) transistors.

The stress concentration portion of the beams are a boundary portion on the beams connected to at least one of the support base and the seismic mass.

It is possible that the support base and the seismic mass, and the beams are structured by using (100)-oriented silicon single crystal substrate and the beams are arranged in a direction parallel to the crystallographic axis <011>.

The sensor may be structured by a configuration wherein the seismic mass surrounds the support base.

The sensor may be structured by a configuration wherein at least one of beams are arranged at each of the both sides of either the support base or the seismic mass, and the differential amplifier circuits is structured by arranging two strain detecting elements at the boundary portions between each the beam and the support base.

The sensor may be structured by a configuration at least one of beams are arranged at each of the both sides of either the support base or the seismic mass, and the differential amplifier circuits is structured by arranging two strain detecting elements at the boundary portions between each the beam and the seismic mass.

The sensor may be structured by a configuration wherein at least one of beams are arranged at each of the both sides of either the support base or the seismic mass, and the differential amplifier circuits is structured by arranging one strain detecting element at the boundary portion between each the beam and the support base and by arranging one strain detecting element at the boundary portion between each the beam and the seismic mass.

The sensor may be further comprised of two current sources for driving two pairs of the differential amplifier circuits detecting an acceleration component in a uni-axial direction, and a switch for switching of the two current sources at high frequency.

BRIEF DESCRIPTION OF THE DRAWINGS

FIGS. 18A to 18D are process diagrams showing fabrication processes;

BEST MODE FOR CARRYING OUT THE INVENTION

Preferred embodiments of the present invention will be described in detail with reference to the drawings.

The embodiment according to the present invention will be described based on FIG. 5 to FIG. 20.

First, the structure of the accelerometer will be described based on FIG. 5 to FIG. 7.

Figure 1:
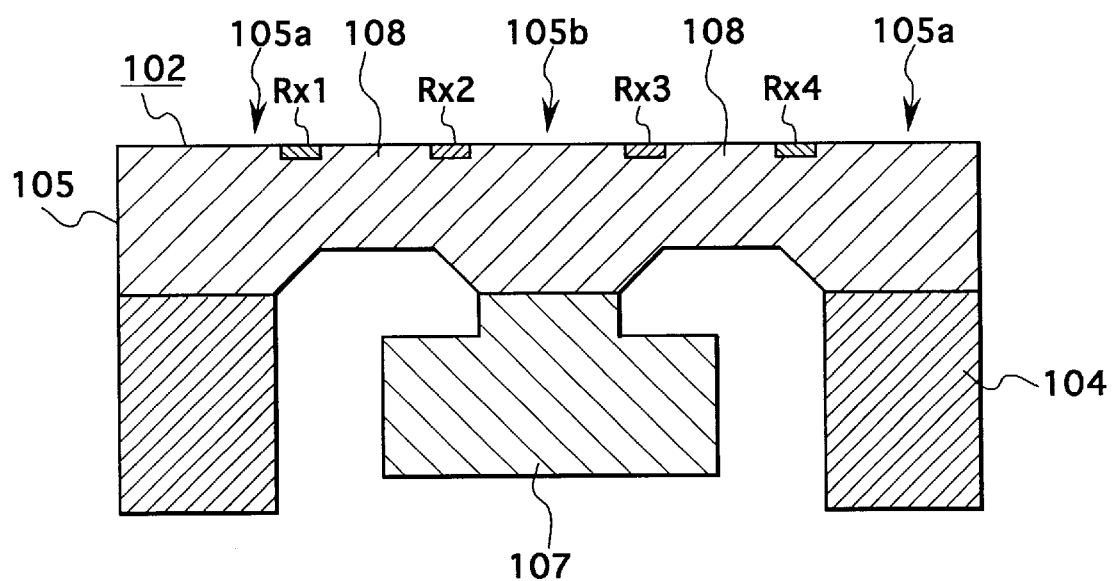
FIG. 1 is a cross sectional view showing a structure of an accelerometer of the first example according to the prior art.
Figure 2:
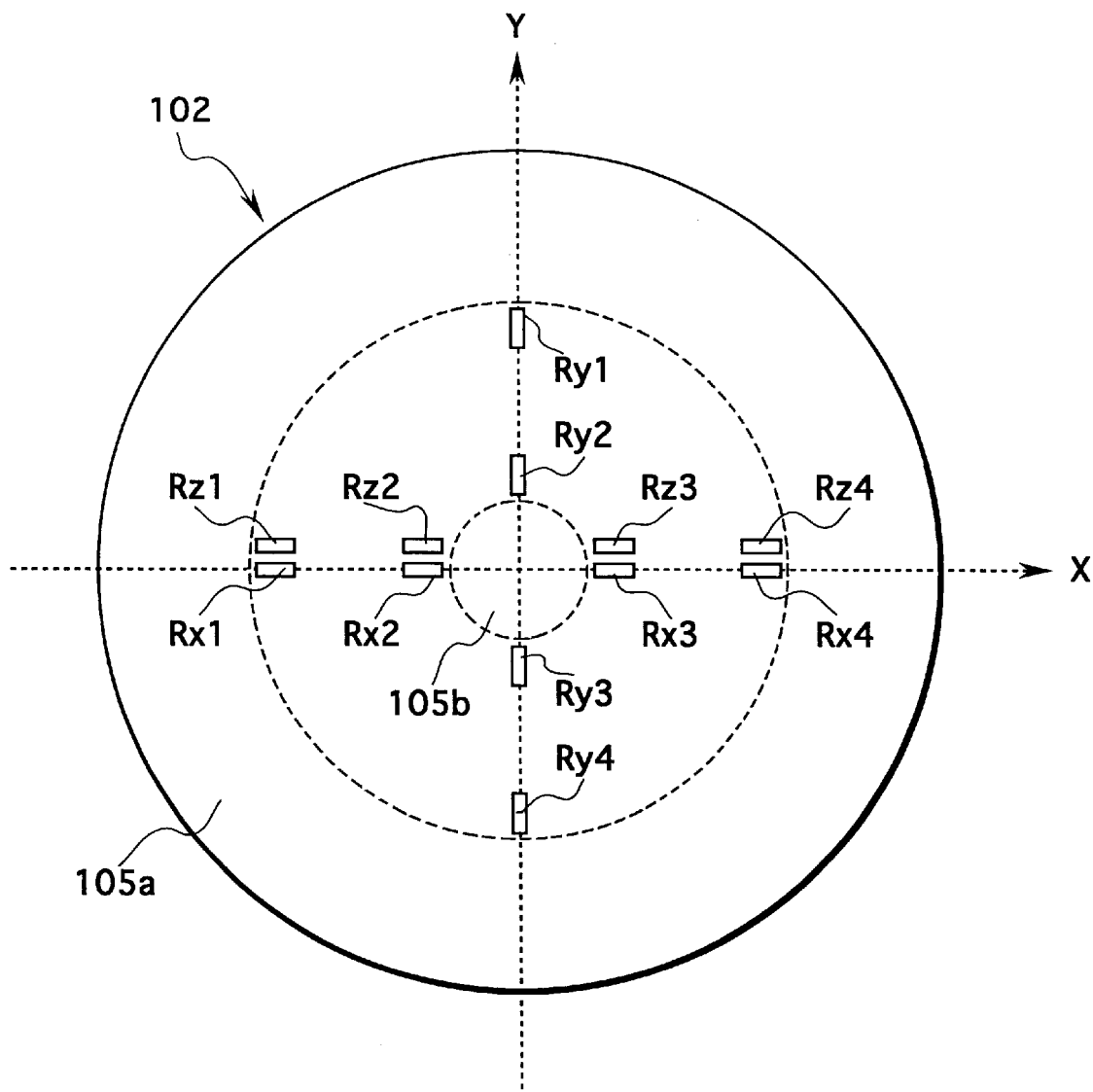
FIG. 2 is a top view of the accelerometer of FIG. 1.
Figure 3:
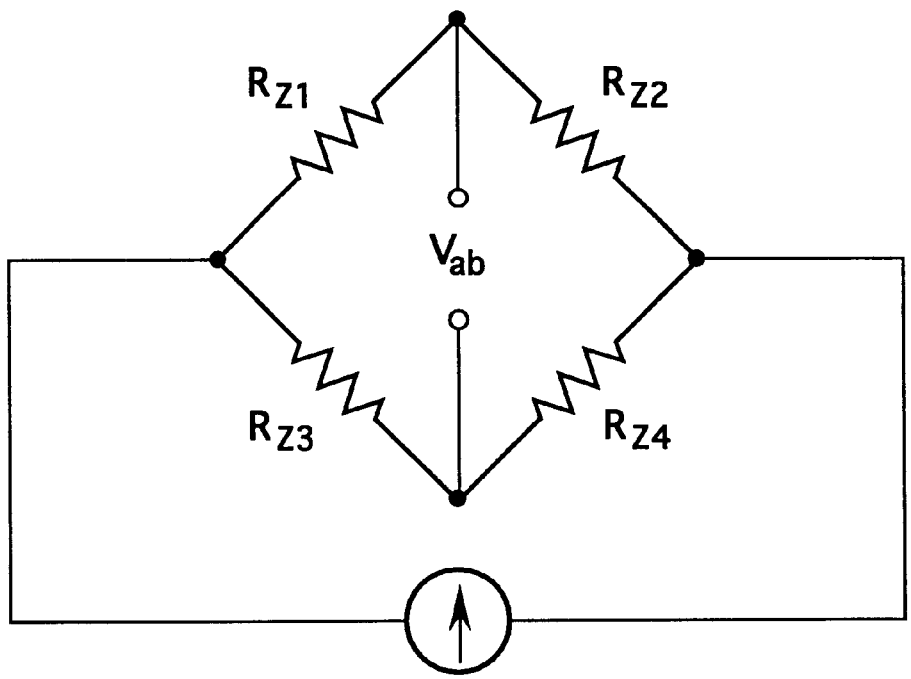
FIG. 3 is a circuit diagram of a bridge circuit for detecting the Z axis acceleration component.
Figure 4A:
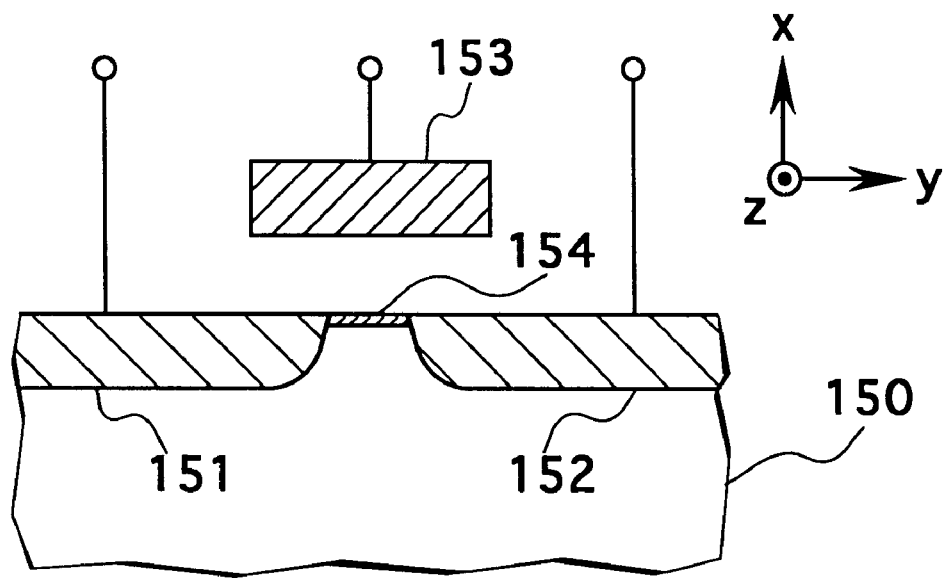
FIG. 4A is a cross sectional view of the accelerometer of the second example according to the prior art and FIG. 4B is a top view thereof.
Figure 4B:
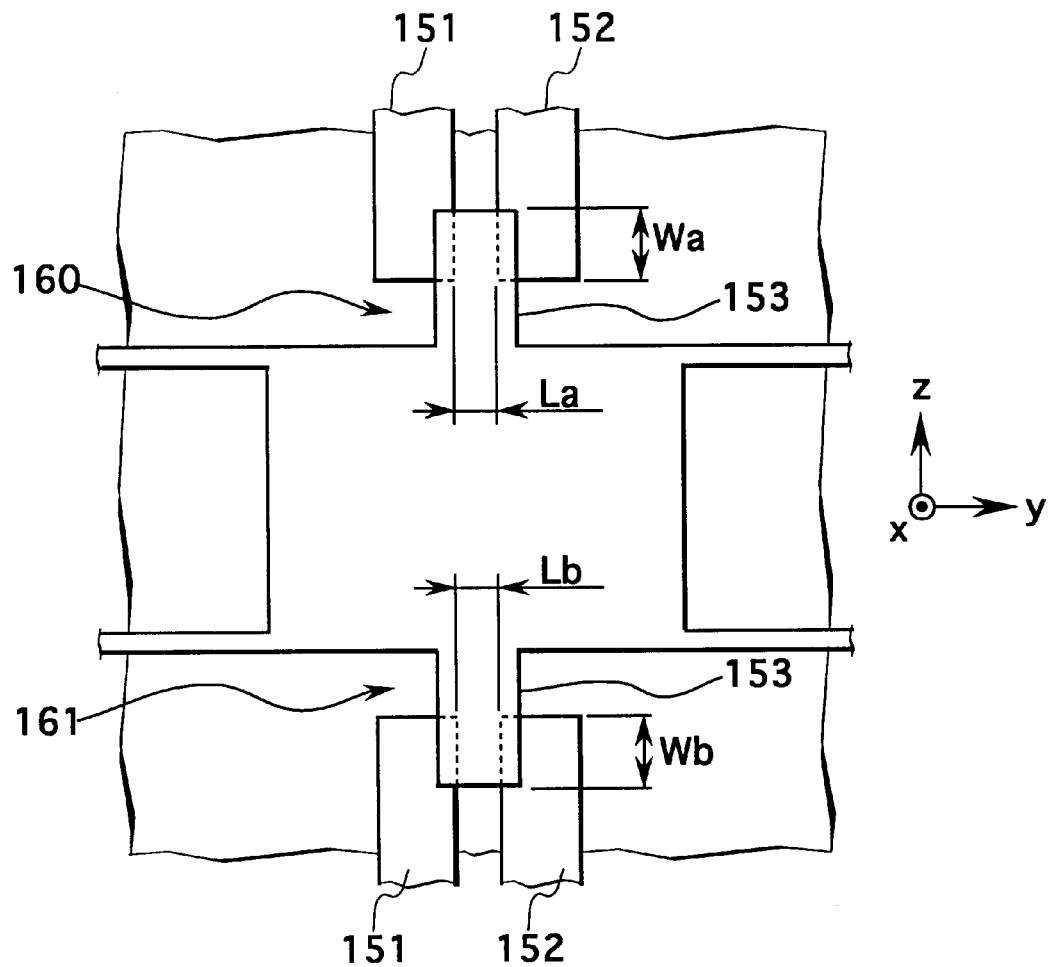
Figure 5:
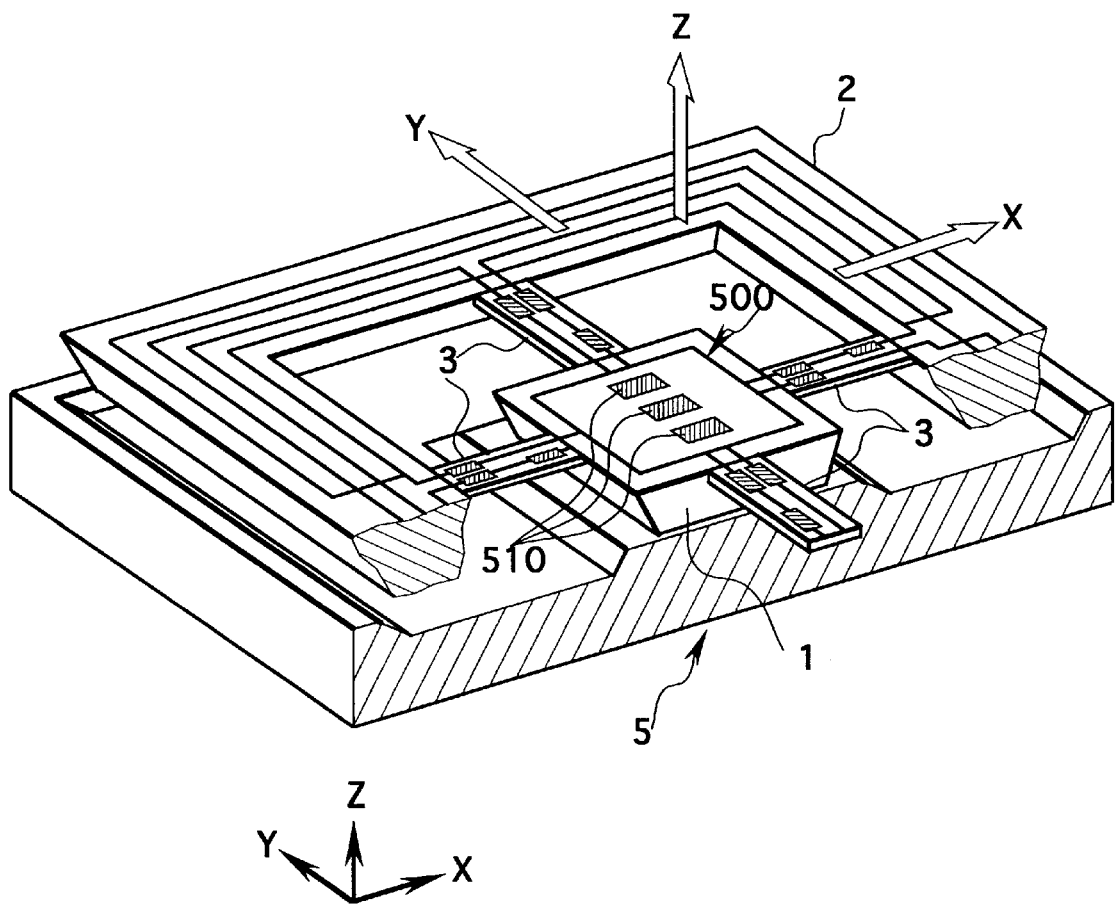
FIG. 5 is a bird's-eye view showing the structure of the accelerometer.

In FIG. 5, a support base 1 is formed in the central portion and a seismic mass 2 is formed in the periphery of the support base 1. The support base 1 and the seismic mass 2 are connected to each other through several beams 3 whose thickness are as thin as 10 µm or so. The beams 3 are formed along either of the X or Y direction. A glass plate 5 comprising a glass (SiO$_2$ is main component) is bonded to the lower portion of the support base 1.

Totally twelve strain detecting elements 411–414, 421–424, and 431–434 are formed on the stress concentration portions of the beams 3. Each of these strain detecting elements 411–434 are structured by respective p-channel MOSFETs (hereinafter referred to as a pMOS transistor). In this case, pMOS transistors 411–434 are formed as the p-type inversion layers to detect strain.

A signal processing portion 500 having differential amplifier circuits 510 electrically connected to the pMOS transistors 411–434 is formed on the support base 1.

Figure 8:
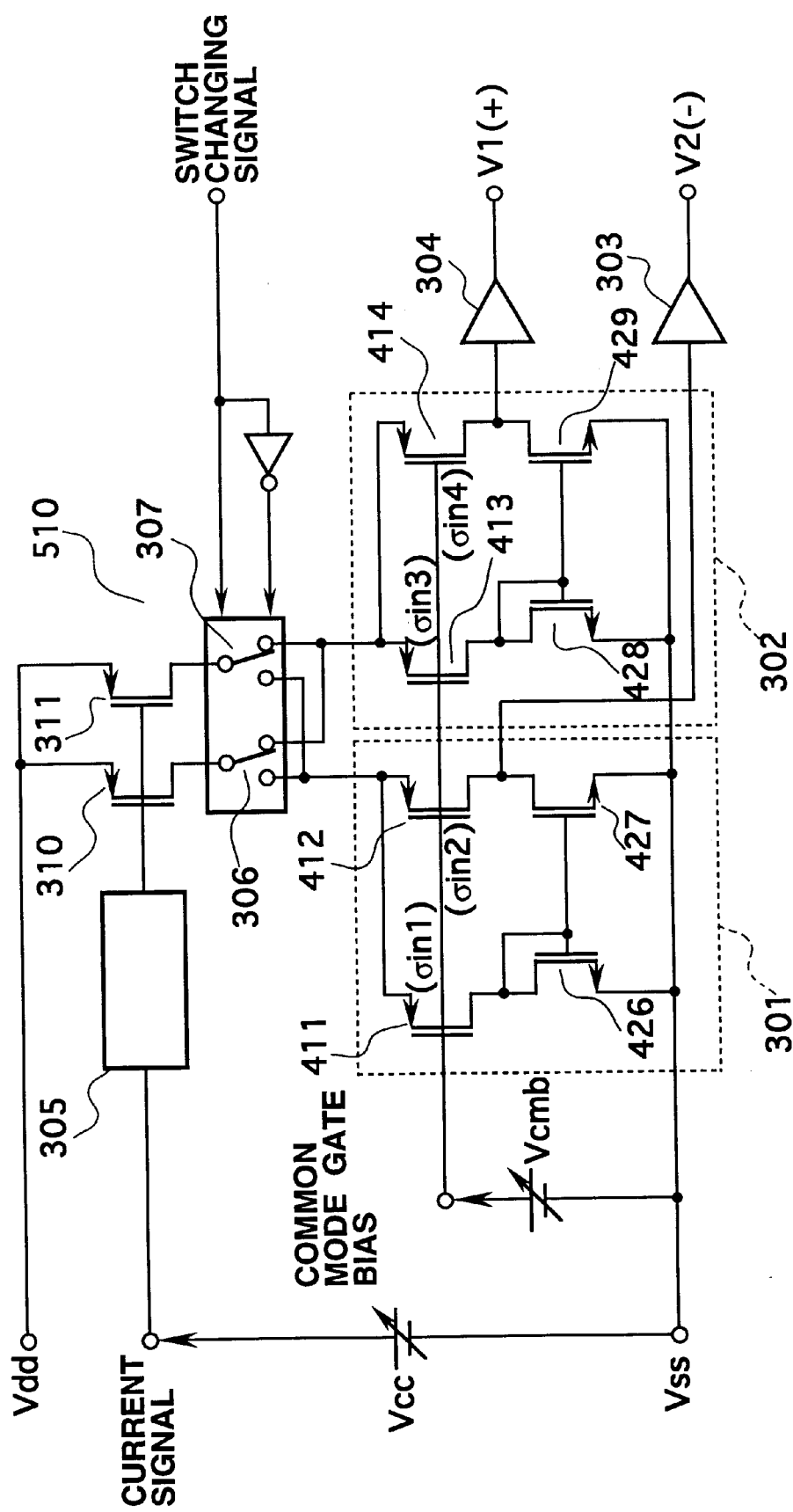
FIG. 8 is a circuit diagram showing an electric structure of the accelerometer as an embodiment according to the present invention.

This signal processing portion 500, as shown in FIG. 8 (given later), is structured as a CMOS integrated circuit for processing signal.

The support base 1, the seismic mass 2, and the beams 3 are structured by using (100)-oriented silicon single crystal substrate. The beams 3 connected between the support base 1 and the seismic mass 2 are arranged along a direction parallel to the crystallographic axis <011>.

Figure 6:
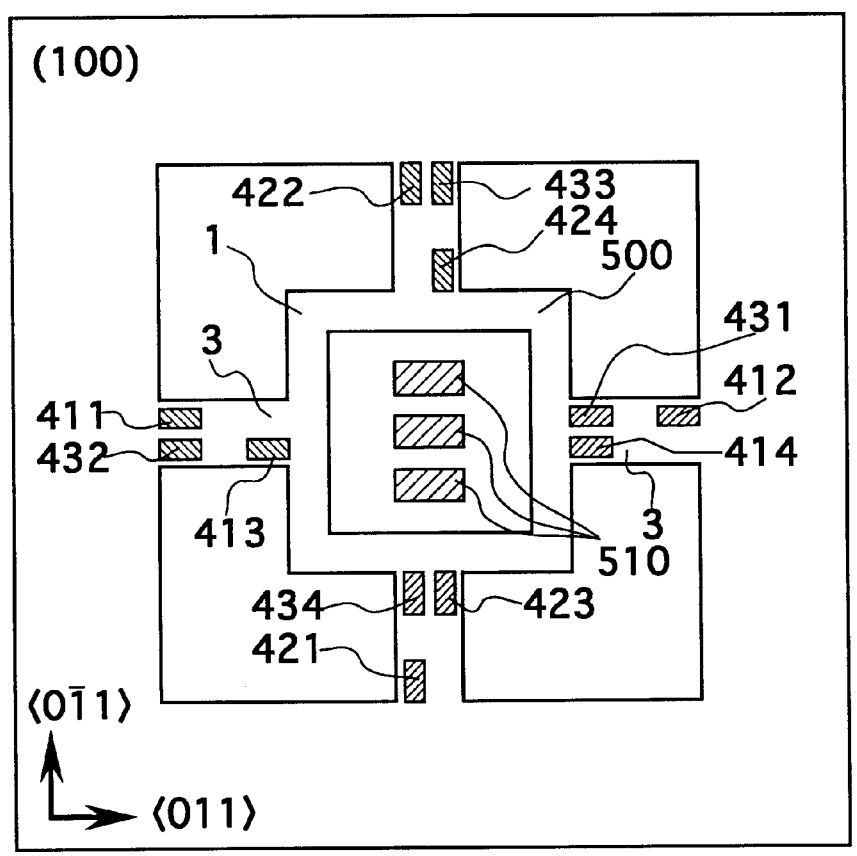
FIG. 6 is a top view showing the structure of the sensor portion.

In FIG. 6, pMOS transistors 411–414 for detecting the stress in the X direction are formed at ends of the beam 3 according to stress concentration portions in the X direction. In this case, the pMOS transistors 411 and 412 are arranged at the ends in the vicinity of the boundary portions connected to the seismic mass 2; the pMOS transistors 413 and 414 are arranged at the ends in the vicinity of the boundary portions connected to the support base 1.

pMOS transistors 421–424 for detecting the stress in the Y direction are formed at the ends of the beams 3 according to stress concentration portions in the Y direction. In this case, the pMOS transistors 421 and 422 are arranged at the ends in the vicinity of the boundary portions connected to the seismic mass 2; the pMOS transistors 423 and 424 are arranged at the ends in the vicinity of the boundary portions connected to the support base 1.

pMOS transistors 431–434 for detecting the stress in the Z direction are formed at the ends of the beams 3 according to stress concentration portions in the X and Y directions. In this case, a pMOS transistor 431 is arranged at the same position as that of a pMOS transistor 414 arranged in the X direction; a pMOS transistor 432 is arranged at the same position as that of a pMOS transistor 411 arranged in the X direction. A pMOS transistor 433 is arranged at the same position as that of the pMOS transistor 422 arranged in the Y direction; a pMOS transistor 434 is arranged at the same position as that of the pMOS transistor 423 arranged in the Y direction.

Figure 7:
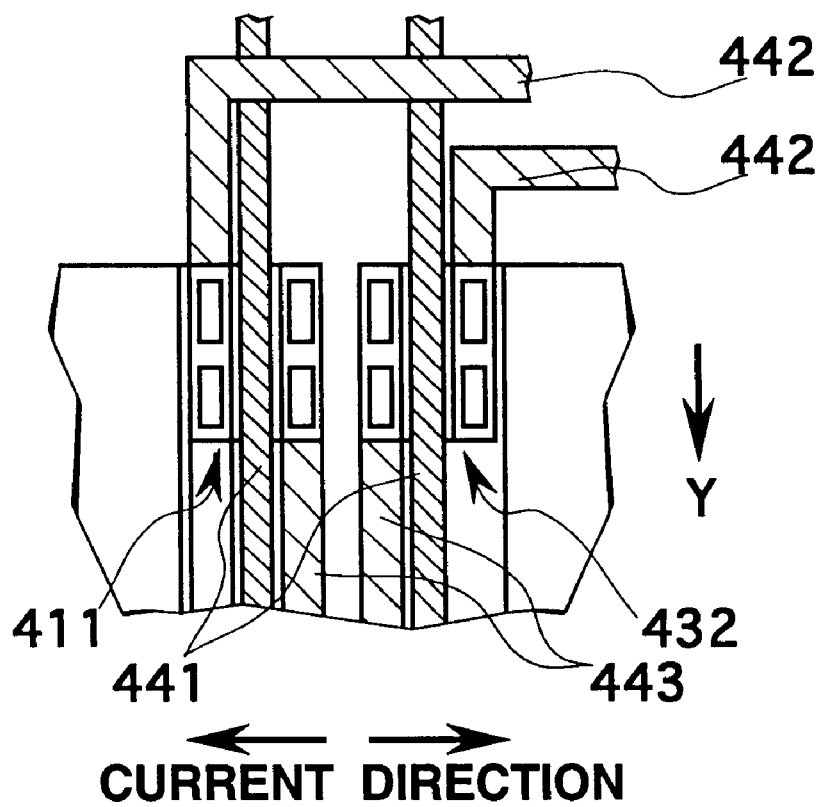
FIG. 7 is an enlarged layout showing sensing elements.

FIG. 7 is an enlarged layout showing each of pMOS transistors 411–434. A pattern 442 of the source electrode and a pattern 443 of the drain electrode were laid out through a pattern 441 of the gate electrode.

Next, the piezo-resistance effect of the p-type inversion layer as well as the effects of the crystal plane (100) and the crystallographic axis <011> of a silicon single crystal substrate will be described as follows.

It is known that a piezo-resistance effect which occurs in the inversion layer generated by the perpendicular electric field to the silicon surface is the same effect as a bulk silicon crystal. The piezo-resistance coefficients ($\pi 11$, $\pi 12$) in the p-type inversion layer are largely different from the piezo-resistance coefficients of the p-type bulk silicon, but the dominant piezo-resistance coefficient ($\pi 44$) therein has almost the same value as that of the p-type bulk silicon.

Therefore, it is possible that the sensing elements can be formed in the stress concentration portion on the beam, thus substituting the inversion layer for the conventional piezo-resistance element formed by the diffusion resistance. Especially, in the case of integrating a peripheral circuit as well as the inversion layer at the same time by using the CMOS LSI fabrication technology, the detecting elements can be formed without modification of the conventional technique, so that this method is an extremely effective technique.

Moreover, it is known that the piezo-resistance coefficient in the inversion layer has a characteristic of perpendicular electric field dependence, and therefore has an advantage of controlling piezo-resistance effect based on the gate voltage.

In general, when a mechanical stress is applied to a semiconductor element, carrier mobility changes. In the case of the MOSFET, since the carrier mobility is proportional to the drain current, the relationship between the strain generated in the semiconductor element based on a mechanical stress and the drain current may be defined as "piezo-resistance coefficient."

Here, the relationship between the stress ε and the drain current Id of the pMOS transistor will be described as follows.

By the way, πl defines the piezo-resistance coefficient when the stress is applied in a direction parallel to a direction of current flow; πt defines the piezo-resistance coefficient when the stress is applied in a direction perpendicular to the direction of current flow.

The piezo-resistance coefficients πl and πt when the crystal plane is (100) and the crystal axis is <011> as well as πl and πt when the crystal plane is (100) and the crystal axis is <0⁻11> have an excellent characteristic of the drain current Id according to the stress ε.

In this example, as shown in FIG. 6, a substrate of the crystal plane (100) is used and the beams 3 on which pMOS transistors 411–434 are formed are shaped along a direction parallel to the crystallographic axis <011> or <0⁻11>. With respect to the acceleration component in each axis direction, detection accuracy of the change in the drain current Id, namely, the output voltage of the differential amplifier circuit 510 can be improved.

Next, the pMOS transistors 411–434 and an electric circuit structure of the differential amplifier circuit 510 will be described referring to FIG. 8.

FIG. 8 shows a configuration of the differential amplifier circuit 510 for detecting a acceleration component in one axis.

Numerals 411–414 denote pMOS transistors (strain detecting elements) formed in stress concentration parts on the beams 3 that can create p-type inversion layers therein. All circuit elements except these pMOS transistors 411–414 are formed on the support base 1 as the differential amplifier circuits 510. Each of the differential amplifier circuits 510 shown in FIG. 8 detects an acceleration component in the sensitive axis direction as the differential mode operation, and detects an acceleration component in other axis directions as the common mode operation, according to the change of the stress in the pMOS transistors 411–414.

Numerals 301 and 302 are source coupling circuits in which the pMOS transistors 411–414 for detection that are formed on the beams 301, 302. Both the nMOS transistors 426, 427 of the source coupling circuit 301 and nMOS transistors 428, 429 of the source coupling circuit 302 are formed on the support base 1.

Numerals 303, 304 denote source follower circuits for performing impedance conversion to external circuits. Output values V1 and V2 of this source follower circuit) 303, 304 are equivalent to outputs of the differential amplifier circuits 510, and these values V1, V2 are outputted as signals either of the differential mode or of the common mode.

Numeral 305 denotes a bias circuit for controlling the currents of the pMOS transistors 310, 311 based on an external voltage.

Numerals 306, 307 denote switches for controlling switching at high-frequency based on switch changing signals. The switch 306 performs switch changing control between the pMOS transistor 310 and source coupling, circuits 301 or 302. The switch 307 performs switch changing control between the pMOS transistor 311 and source coupling circuits 301 or 302.

Further, these switches 306, 307 have a function in which an offset voltage caused by the fabrication imbalance between the two current sources (the current source of the pMOS transistors 411, 412 and the current source of the pMOS transistors 413, 414) as well as a flicker noise generated in transistors of the current sources can be modulated up to a clock frequency or over, and then the modulated signals can be removed by using a low-pass filter.

A symbol Vcmb denotes a power supply which sets a common mode gate bias voltage for forming p-type inversion layers in the pMOS transistors 411–414. In this case, since the common mode gate bias voltage Vcmb changes the vertical electric field for forming the p-type inversion layers and, at the same time, changes the operating point of the amplifier circuits, the value of the piezo-resistance coefficients π and the circuit parameters, etc. change, thereby changing the sensor sensitivity on the whole.

A symbol Vdd denotes a power supply for supplying electric power to the sources of the pMOS transistors 310, 311. A symbol Vcc denotes a control voltage for controlling the driving current of the bias circuit 305.

Further, in the case of the differential amplifier circuits for detecting triaxial components, three pairs of differential amplifier circuits 510 shown in FIG. 8 are formed in the support base 1 of a sensor chip. In this case, by adopting a configuration wherein the pMOS transistors 411–434 are arranged at positions on the beams 3 shown in FIG. 6, when the acceleration is applied to each of the X, Y, and Z directions, the output values V1 and V2 of the source follower circuits 303, 304 are outputted as signals of the differential mode for the acceleration component in the sensitive axis direction, and are outputted as signals of the common mode for the acceleration components in the other axis directions.

By virtue of this configuration, the sensitive axis acceleration component can be detected with high sensitivity, and the other axis acceleration components can be detected with low sensitivity.

Next, a principle of operation of the differential amplifier circuit 510 will be described referring to FIG. 9 to FIG. 10.

Figure 9:
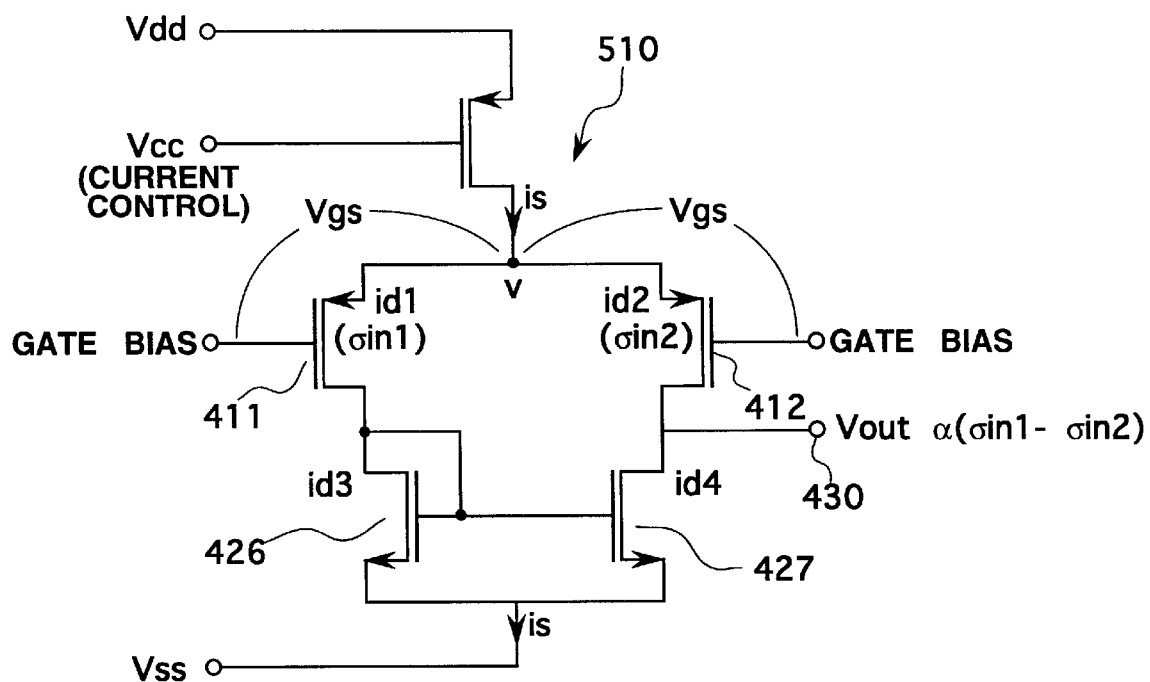
FIG. 9 is a circuit diagram showing a basic structure of the present invention.
Figure 10:
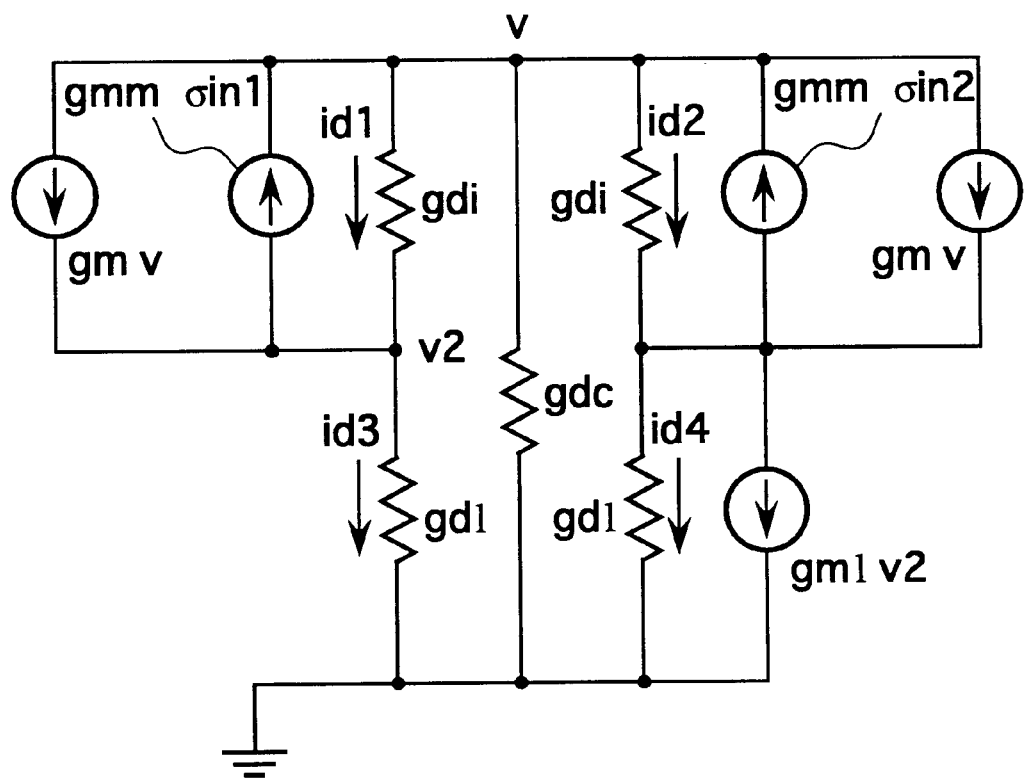
FIG. 10 is a circuit diagram of a small signal equivalent circuit according to the differential amplifier circuit of FIG. 9.

FIG. 9 shows a basic structure of a stress-electric signal converter circuit used in this sensor. The pMOS transistors 411, 412 correspond to the source coupling circuit 301 of FIG. 8. FIG. 10 shows a small signal equivalent circuit according to the circuit of FIG. 9.

In this equivalent circuit, a current source gmm σin1 is newly provided in consideration of the modulation of the conductivity due to stress σin1. In this case, since the current source gmm σin1 is controlled by the stress, the mechanical transconductance gmm according to the stress of the pMOS transistor 411 is defined as a proportion constant.

On the other hand, in a small signal equivalent circuit of a normal MOSFET, the current source is represented by a product of gm and the input voltage. In this circuit, the source voltage V of the pMOS transistor 411 changes according to the input of the stress σin1, thus changing the voltage Vgs between the gate and the source, and then the current source is defined as gmv.

Therefore, the drain current id1 can be defined as a sum of the normal current source gmv and the current source gmm σin1 based on the stress.

Similarly, in the case of the pMOS transistor 412, the drain current id2 can be defined as a sum of the current source gmv and the current source gmm σin2.

Further, a drain current flowing in the nMOS transistor 426 is defined as id3, and a drain current flowing in the nMOS transistor 427 is defined as id4. A current source of these nMOS transistors 426, 427 is defined as gmlv2. By the way, the substrate effect of the pMOS transistors 411, 412 is assumed to be ignored.

Further, provided that all of the pMOS transistors 411, 412 and the nMOS transistors 426, 427 are in their saturation ranges, the changes in the drain currents id1, id2 of the pMOS transistors 411, 412 become sums of the changed portions due to the stresses σin1, σin2 and that due to the source voltage V, representing by the following equations (1), (2)

$$id1 = gmm\sigma in1 - gmV, \quad \text{[Equation 1]}$$

$$id2 = gmm\sigma in2 - gmV. \quad \text{[Equation 2]}$$

Furthermore, provided that the current source is ideal, the equation (3)

$$id1 + id2 = 0 \quad \text{[Equation 3]}$$

stands.

Solving the equations (1)–(3) concerning the drain currents id1 and id2, the drain currents are expressed in the equation (4)

$$id1 = -id2 \quad \text{[Equation 4]}$$
$$= \frac{gmm}{2}(\sigma in1 - \sigma in2)$$

The current change of the pMOS transistor 411 is equal to the drain current change of the low impedance nMOS transistor 426, and makes an influence on a current change in the nMOS transistor 427 structured as a current mirror. The relationship between each of currents is expressed by the equation (5)

$$id4 \approx id3 \quad \text{[Equation 5]}$$
$$= id1.$$

Therefore, a current flowing into an output terminal 430 is expressed by the equation (6)

$$id4 - id2 = 2id1 \quad \text{[Equation 6]}$$
$$= gmm(\sigma in1 - \sigma in2).$$

At the output terminal 430, the drain conductance of the pMOS transistor 412 and the nMOS transistor 427 are defined as a load, and therefore the output voltage Vout is expressed by $$Vout = \frac{2id1}{gdi + gdl} \quad \text{[Equation 7]}$$
$$= \frac{gmm}{gdi + gdl}(\sigma in1 - \sigma in2)$$

This equation indicates that the output voltage Vout proportional to the differential signal (=σin1−σin2) of the stresses σin1 and σin2 can be obtained.

Here, the mechanical transconductance gmm according to the stress σ will be examined.

π is defined as the piezo-resistance coefficient and σ is defined as a stress applied to the inversion layer, when each current direction is considered, respectively, and further, provided that any change caused by a stress except the mobility can be ignored, the drain current ID (=id1, id2) of the pMOS transistors 411, 412 operating at saturation area are expressed by the equation (8)

$$ID(\sigma, Vgs) = \frac{\mu n(1 + \pi\sigma)CoxW}{2L}(Vgs - Vr) \quad \text{[Equation 8]}$$
$$= IDO(1 + \pi\sigma),$$

IDO is a drain current when the stress input is zero, where μn is the carrier mobility of the MOSFET when the stress is not applied, Cox is the gate capacitance of the MOSFET, w is the gate width, L is the gate length, and VT is the threshold voltage.

Thus, gmm of the pMOS transistors 411, 412 is expressed by $$gmm = \frac{\partial ID(\sigma, Vgs)}{\partial \sigma} \quad \text{[Equation 9]}$$
$$= IDO\pi$$

Therefore, gmm is proportional to the drain current and the piezo-resistance coefficient. Further, using the equation (7), the conversion coefficient Tdm according to the output voltage Vout of the differential signal is expressed by $$Tdm = \frac{Vout}{\sigma in1 - \sigma in2} \quad \text{[Equation 10]}$$
$$= \frac{gmm}{gdi + gdl}$$
$$= \frac{IDO\pi}{gdi + gdl}$$

As is described in the foregoing, the circuit shown in FIG. 9 has the same configuration as that of the differential amplifier circuit as a voltage amplifier, and has a high common mode stress signal rejection ratio according to the common mode stress inputs. (In principle, in the case of the common mode inputs, the equation (7) reduces to zero, indicating that the common mode stress signal rejection ratio becomes infinity.)

Therefore, by arranging the pMOS transistors 411–434 on the beam 3 so that the stress generated by the acceleration components in the off-axis except the sensitive axis becomes the common mode, and the stress generated by the acceleration components in the sensitive axis becomes the differential mode, the sensitivity ratio (other axis sensitivity) between the sensitive axis and the other axis become a reciprocal of the common mode stress signal rejection ratio of the detecting circuit.

By the way, input transistors (strain detecting elements) in the differential amplifier circuits are not restricted to be p-channel MOSFET but may be bi-polar transistors etc.

Next, the principle of detecting only the acceleration component in the sensitive axis direction to which the acceleration is applied, by removing the acceleration components in the other axis directions, will be described referring to FIG. 11 to FIG. 14. The positions at which the pMOS transistors 411–414 are arranged correspond to the positions of FIG. 6 and FIG. 8.

<Detection Principle of the X Axis and Y Axis Components>

The detection principle of the X axis direction will be described.

Here, a circuit comprised of a pMOS transistor 411 and a pMOS transistor 412 is taken as an example.

Figure 11:
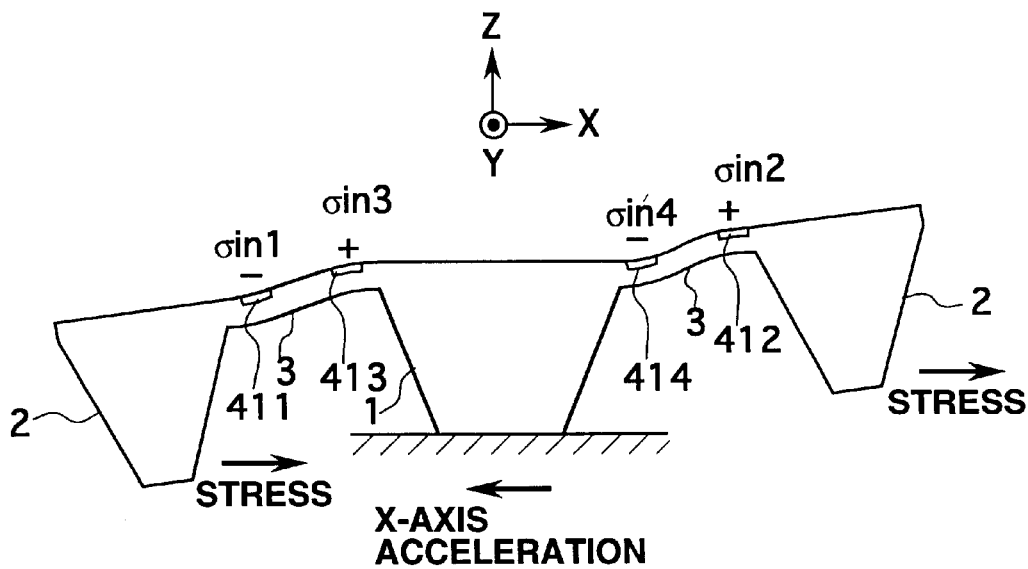
FIG. 11 is a schematic view showing a principle of strain detection with the use of the bending of a beam.

FIG. 11 shows how the beam 3 bends when the acceleration is applied in the X direction (the leftward direction in the FIG. 11). Since the pMOS transistor 411 is applied to negative (minus) stress σin1 and the pMOS transistor 412 is applied to a + (plus) stress σin2, term (σin1−σin2) of the equation (7) is calculated by addition. The value of this term (σin1−σin2) multiplied by the conversion coefficient Tdm of the equation (10) is outputted as the output voltage.

Figure 12:
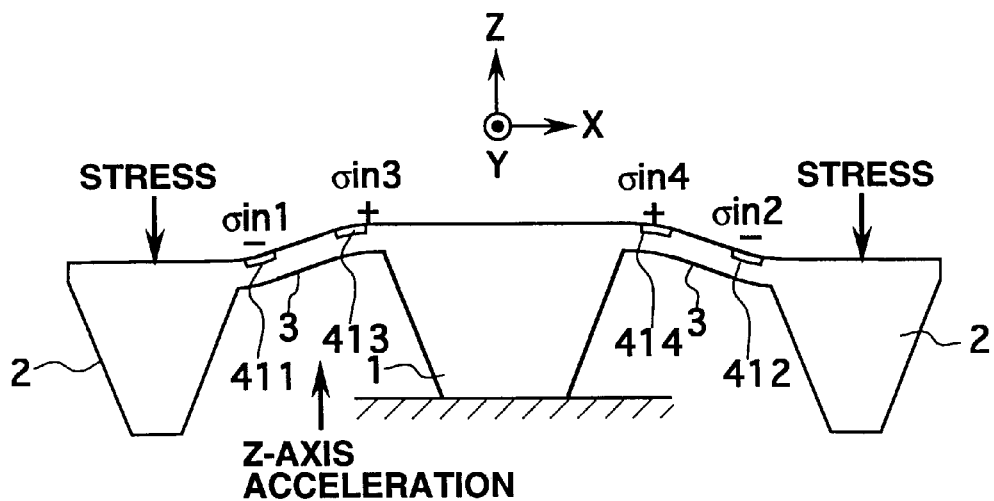
FIG. 12 is a schematic view showing the principle of the strain detection with the use of the bending of a beam.

FIG. 12 shows how the beam 3 deforms when the acceleration is applied in the Z direction (the upward direction in FIG. 12). Since the pMOS transistor 411 and the pMOS transistor 412 are applied to the stresses σin1 and σin2, respectively, which have the same sign (negative) and the same magnitude, the term (σin1−σin2) of the equation (7) becomes zero.

By the way, the detection principle of the Y axis direction is also the same as that of X axis direction.

<Detection Principle of the Z Axis Direction>

The detection principle of the Z axis direction will be described.

Here, a circuit comprised of the pMOS transistor 431 and pMOS transistor 432 is taken as an example.

Figure 13:
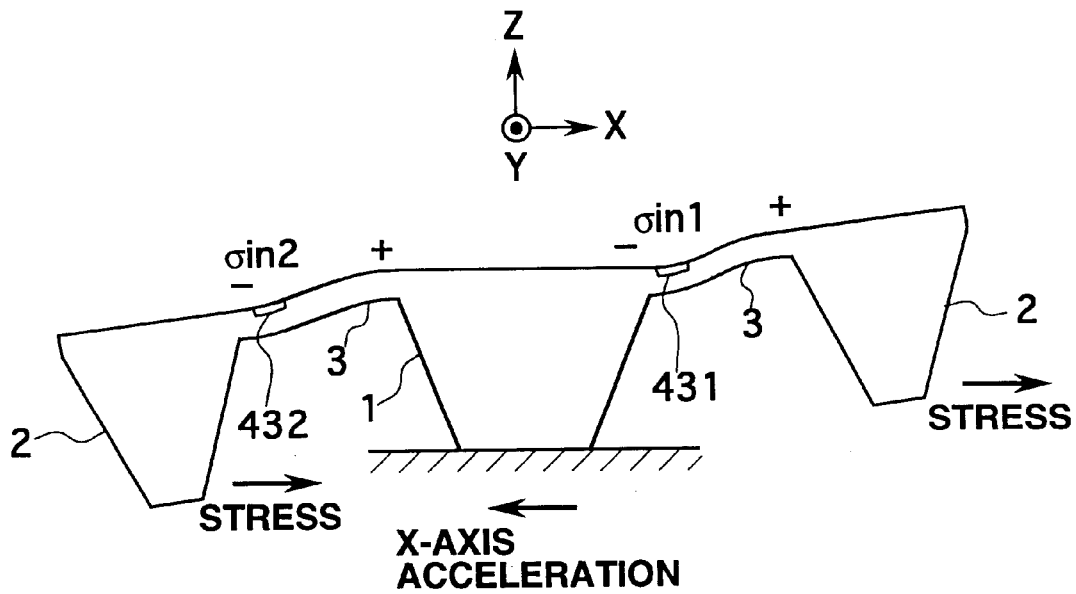
FIG. 13 is a schematic view showing the principle of the strain detection with the use of the bending of a beam.

In FIG. 13, when the acceleration is applied in the X direction (the rightward direction in FIG. 13), the pMOS transistor 431 and the pMOS transistor 432 are applied to the stresses σin1 and σin2, respectively, which have the same sign (negative) and the same magnitude, and then the term (σin1−σin2) of the equation (7) becomes zero, and hence the output voltage becomes zero.

Figure 14:
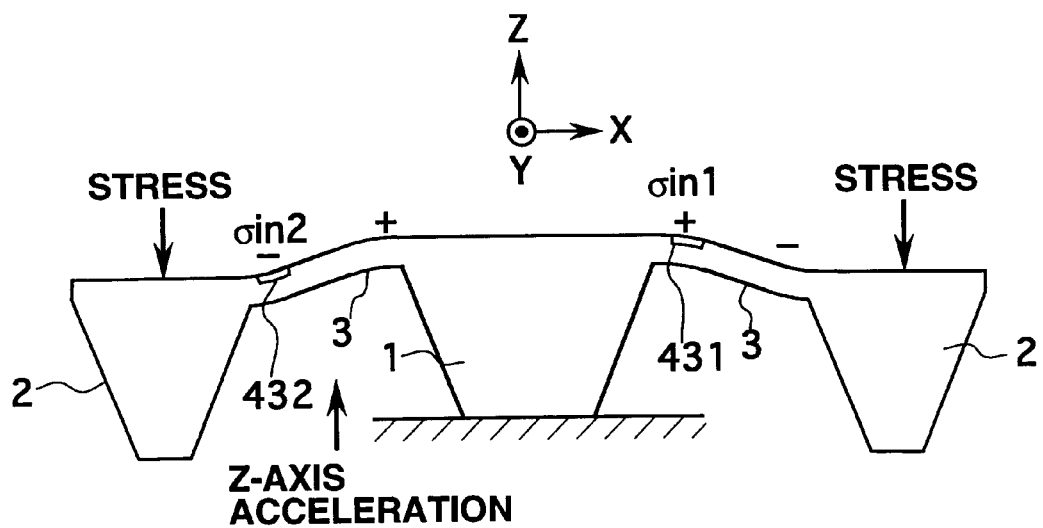
FIG. 14 is a schematic view showing the principle of the strain detection with the use of the bending of a beam.

In FIG. 14, when the acceleration is applied in the Z direction (the upward direction in FIG. 14), the pMOS transistor 431 is applied to a positive (plus) stress σin1 and the pMOS transistor 432 is applied to a negative (minus) stress σin2, and then the term (σin1−σin2)of the equation (7) is calculated by addition to obtain the output voltage.

Therefore, by detecting only the acceleration component in the sensitive axis direction to which the acceleration is applied as the differential mode operation and by detecting the acceleration components in the other axis directions as the common mode operation, the other axis acceleration components can be removed.

Next, various characteristics measured by structuring accelerometer for trial purpose will be described referring to FIG. 15 to FIG. 17. Here, measurement results using a shaker with input frequency in the range from 50 Hz to 5 kHz will be described.

<Relationship Between the Acceleration Detection Characteristic and the Other Axis Sensitivity>

Figure 15:
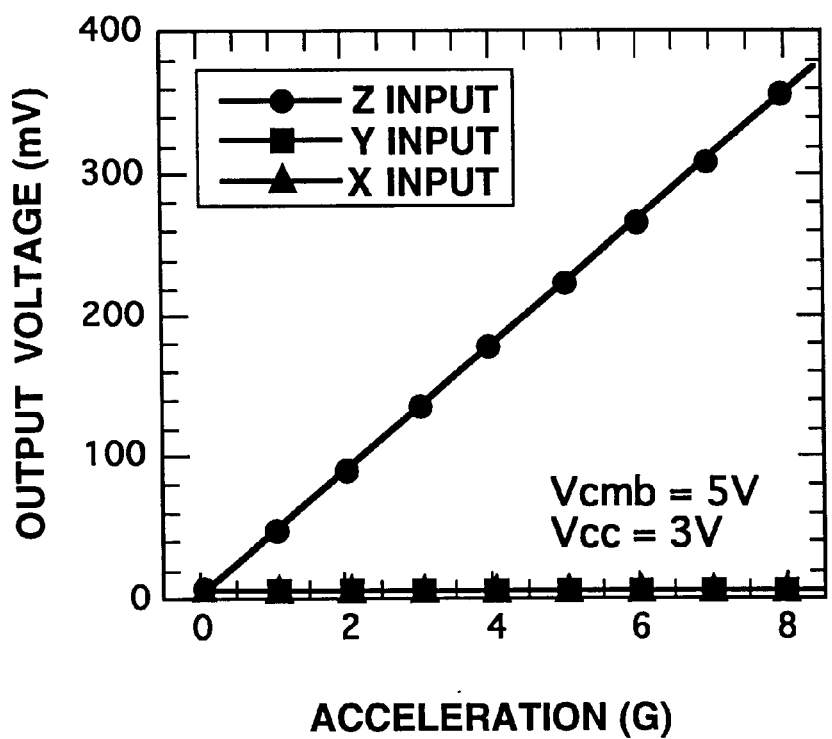
FIG. 15 is a characteristic diagram showing the relationship between the acceleration and an output voltage.

FIG. 15 shows the output characteristic of the acceleration component in the each axis direction when the acceleration is applied to the Z direction. In FIG. 15, the output voltages according to the acceleration components in the X and Y directions, which are the other axis directions, are suppressed to a low level, and then the output voltage according to the acceleration component in the Z direction, which is the sensitive axis direction of the sensor in concern, can be made to be proportional to the acceleration.

When the detecting circuit of this sensor is considered as a differential amplifier circuit, and the reciprocal of the measurement results of the common mode voltage signal rejection ratio is calculated to be 0.002 (0.2%). Therefore, when input signal is stress, it is expected that the sensitivity according to the common mode stress signal will be 0.002 times or so as compared to that of the differential mode stress signal.

However, in a sensor device structured for the trial purpose, when the acceleration is applied in the Z axis direction, the ratio of the common mode stress sensitivity (namely, the X axis and Y axis component outputs) to the differential stress sensitivity (namely, the Z axis component detection output) is measured to be 0.028 (2.8%). This value (2.8%) is larger than the above-described 0.2% by the order of unity or so.

This means that there is approximately 2.8% of imbalance in the stress caused by asymmetricity error of the structure in the fabrication step of the sensor. It is considered that normally the fabrication error is regarded as a few percents and then a degree of the, sensitivity according to the common mode stress signal is determined mainly by the degree of the fabrication error. If the sensor sensitivities according to all axes are on the same value, 2.8% is directly regarded as the other axis sensitivity, however, in this sensor, the sensitivities according to the X axis and the Y axis differ from that according to the Z axis, and therefore the relationship of the sensitive axis sensitivity to the other axis sensitivities is somewhat complicated.

Table 1 shows the detection sensitivity and the other axis sensitivity of the detection circuit according to each axis in the sensor for the trial purpose.

TABLE 1

|  | Z | X | Y |
| --- | --- | --- | --- |
| Sensitivity (mV/G) | 44.8 | 4.6 | 4.6 |
| Off-axis sensitivity (%) | 2% or less | 25% or less | 25% or less |

(Vcc = 3 V    Vcmb = 5 V)

Since the stress applied in the beam according to the Z axis acceleration component is 10 times the X axis and Y axis acceleration components or so, the X axis and Y axis sensitivity are 10% of the Z axis sensitivity or so.

Therefore, in the X axis and Y axis detection circuits, a common mode stress is inputted about 10 times by applying the Z axis acceleration component, so that the other axis sensitivity of the X axis and Y axis detection circuits become about 10 times (about 25%).

This difference in the sensitivity can be dissolved by increasing the stress applied by the X axis and Y axis acceleration components up to a comparable level to that of the Z axis acceleration component, but it requires in turn for a process of bonding a glass at the lower portion of the seismic mass 2 or the like.

Moreover, as other solution, it is possible to adopt a configuration wherein the erroneous output according to the other axis sensitivity can be canceled by processing the output signal from this sensor with a micro processor or by performing corrective processing of a signal with an analog circuit.

<Relationship of the Voltage Gain and the Detection Sensitivity With the Control Voltage Vcc of the Current Source>

Figure 16:
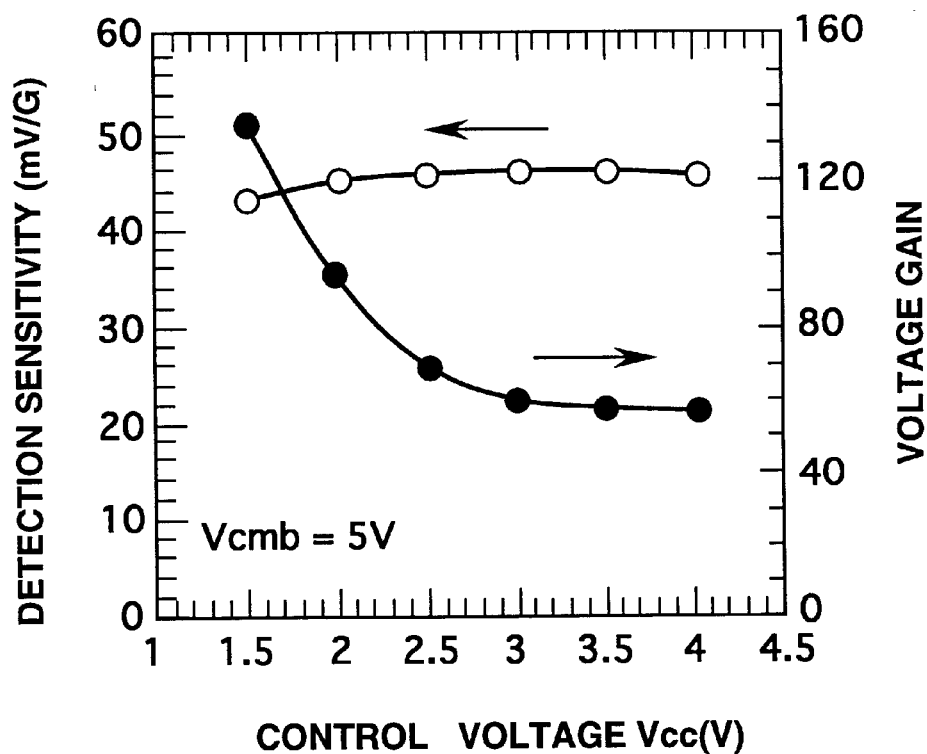
FIG. 16 is a characteristic diagram showing the dependence of a voltage gain and the detection sensitivity according to the control voltage.

FIG. 16 shows the characteristic of the detection sensitivity (i.e. stress sensitivity) according to the Z axis acceleration and the change in the voltage gain when the detection circuit is operated as a differential amplifier circuit, provided that the control voltage Vcc is changed.

In the control range shown in FIG. 16, the bias current is designed to be almost proportional to the control voltage Vcc. The voltage gain is inversely proportional to the control voltage Vcc, that is, to the bias current. The detection sensitivity is almost constant to the change in the control voltage Vcc. This reason will be described as follows.

The voltage gain of the amplifier circuit with use of MOS transistors is, in general, inversely proportional to the square root of the drain current, except a sub-threshold range. This is because that the transconductance gm is proportional to the square root of the drain current, but the drain conductance gd is proportional to the drain current. The measurement results of the voltage gain proved that inverse proportional characteristic.

On the other hand, since the detection sensitivity of this sensor is proportional to the mechanical transconductance gmm and, from the equation (9), gmm is proportional to the drain current, there is no dependence of the bias current on the detection sensitivity. The measurement result of the detection sensitivity proved there is no dependence on the bias current.

Here, the characteristic in FIG. 16 will be described using numerical equations.

As a general rule, in the equivalent circuit of a MOSFET, the relationship is as follows.

$$gm = \frac{\partial id}{\partial Vgs} \qquad \text{[Equation 11]}$$
$$= \sqrt{\frac{2\mu p C_{ox} W \cdot id}{L}} \propto \sqrt{id}$$

$$gd = \frac{\partial id}{\partial Vds} \qquad \text{[Equation 12]}$$
$$= \frac{\lambda id}{1 + \lambda Vds} \propto id \left(\lambda \propto \frac{1}{L}\right),$$

where $\mu p$ is the carrier mobility of the MOSFET with no stress, and $\lambda$ is the channel length modulation parameter of the MOSFET.

When the circuit of FIG. 9 is used as a normal differential amplifier circuit, the output voltage expressed by the equation (7) is as follows.

$$Vout = \frac{gm}{gdi + gdl}(Vin1 - Vin2), \qquad \text{[Equation 13]}$$

where Vin1 is an input voltage of the pMOS transistor 411 and Vin2 is the input voltage of the pMOS transistor 412, and Vin1–Vin2=0 is defined.

If the circuit shown in FIG. 9 is assumed an ideal circuit, the equation (7) is expressed according to the stress input when the differential input voltage (Vin1–Vin2) is zero; and the equation (13) can be expressed according to the differential input voltage when the stress input is zero.

Comparing the equation (7) and the equation (13), the fact that the output voltage is generated according to the stress input may have the same meaning as the fact that the differential input is inputted according to a normal circuit.

Since the offset voltage of the differential amplifier means an input voltage when the output voltage becomes zero, the offset voltage Voff occurs in the amplifier by the existence of the stress input. That is, from the relationship between the equation (7) and the equation (13), $$gmm(\sigma\, in1 - \sigma\, in2) = gm \cdot Voff \qquad \text{[Equation 14]}$$

is obtained.

Further, from the equation (13), the voltage gain (voltage amplification factor) A is obtained as $$A = \frac{Vout}{Vin1 - Vin2} \qquad \text{[Equation 15]}$$
$$= \frac{gm}{gdi + gdl}$$

In this equation, when the sensor is designed in such a way that the current of the current source is proportional to the Vcc, since the following equations 16 and 17

$$gm \propto \sqrt{id}, \qquad \text{[Equation 16]}$$

$$gdi, gdl \propto id \qquad \text{[Equation 17]}$$

Therefore, $$A \propto \frac{1}{\sqrt{id}} \qquad \text{[Equation 18]}$$

is obtained. This voltage gain A appears as a curve shown in FIG. 16.

Further, from the equation (9), a relation $$gmm \propto id \qquad \text{[Equation 19]}$$

is obtained.

From this relation and the equation (14), Voff is expressed by $$Voff \propto \sqrt{id} \qquad \text{[Equation 20]}$$

Finally, since the detection sensitivity of the accelerometer is expressed by a term (offset voltage based on the stress)× (voltage gain A), the detection sensitivity becomes constant as shown in FIG. 16.

<Relationship Between the Detection Sensitivity and the Common Mode Gate Bias Voltage Vcmb>

Figure 17:
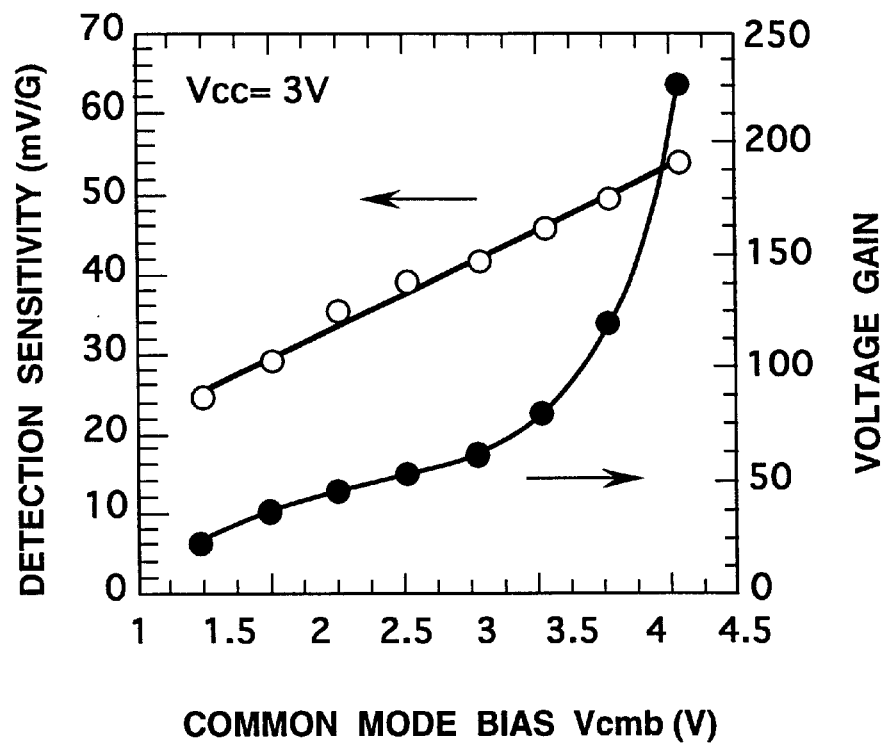
FIG. 17 is a characteristic diagram showing the dependence of the voltage gain and the detection sensitivity according to the common mode gate bias voltage.

FIG. 17 shows the characteristic of the detection sensitivity (stress sensitivity) according to Z axis acceleration and the change in the voltage gain when the detection circuit is operated as a differential amplifier circuit, provided that the common mode gate bias voltage Vcmb is changed.

From this FIG. 17, in the voltage gain, there is a considerably non-linear dependence on the common mode gate bias voltage Vcmb. On the contrary, the detection sensitivity changes almost linearly according to the common mode gate bias voltage Vcmb.

Because the voltage gain changes non-linearly, it is thought that the circuit parameters such as gdl, gdi, etc. are changing non-linearly according to the change in the common mode gate bias voltage Vcmb. On the other hand, the detection sensitivity of this sensor is also defined by gmm. From the equation (10), gmm is proportional to the piezoresistance coefficient π of the inversion layer. That piezoresistance coefficient π is considered to have a nonlinear dependence according to the common mode gate bias voltage Vcmb (a perpendicular electric field applied to the inversion layer). As a result, it is thought that a kind of compensation of the nonlinearity occurs between a numerator and a denominator of the equation (10) and thus the detection sensitivity becomes to have a linear relationship with Vcmb.

In doing the temperature compensation of the detection sensitivity, such a linear characteristic is greatly favorable. The reason for this is that, in a range where the detection sensitivity increases or decreases linearly to the temperature, the sensitivity temperature coefficient can be virtually diminished by controlling the common mode gate bias voltage Vcmb linearly according to the temperature.

Next, the outline of a fabrication process for this sensor will be described referring to FIG. 18 and FIG. 19.

In FIG. 18A, a groove 502 having a 10 μm depth is formed beforehand on the top surface of an n-type silicon substrate 501 in which both sides have polished surface to a mirror finish. This groove 502 may be formed by anisotropic etching.

Further, the signal processing portion 500 including differential amplifier circuits 510 is formed on the silicon substrate 501 by using the standard fabrication process of p-well CMOS circuits. In this case, the pMOS transistors 411–434 are formed at positions corresponding to the beams 3. Further, an oxide film 505 is formed on a bottom surface of the substrate 501.

In FIG. 18B, a coated film 504 (Teflon resin etc.) being highly resistive to the anisotropic etching is formed on the top surface to protect a circuit of the signal processing portion 500 in case of etching.

In FIG. 18C, the oxide film 505 is patterned as an etching mask on the bottom surface.

In FIG. 18D, further, the bottom surface of the substrate 501 is etched by the anisotropic etching at 90° C. while the top surface is protected with a protective gear (not shown). This etching process is stopped when the groove 502 having a 10 μm depth formed beforehand is passed through the substrate 501 by the etching. Therefore, the beams 3 having thin thickness, the support base 1, and the seismic mass 2 can be formed.

Figures 19A, 19B:
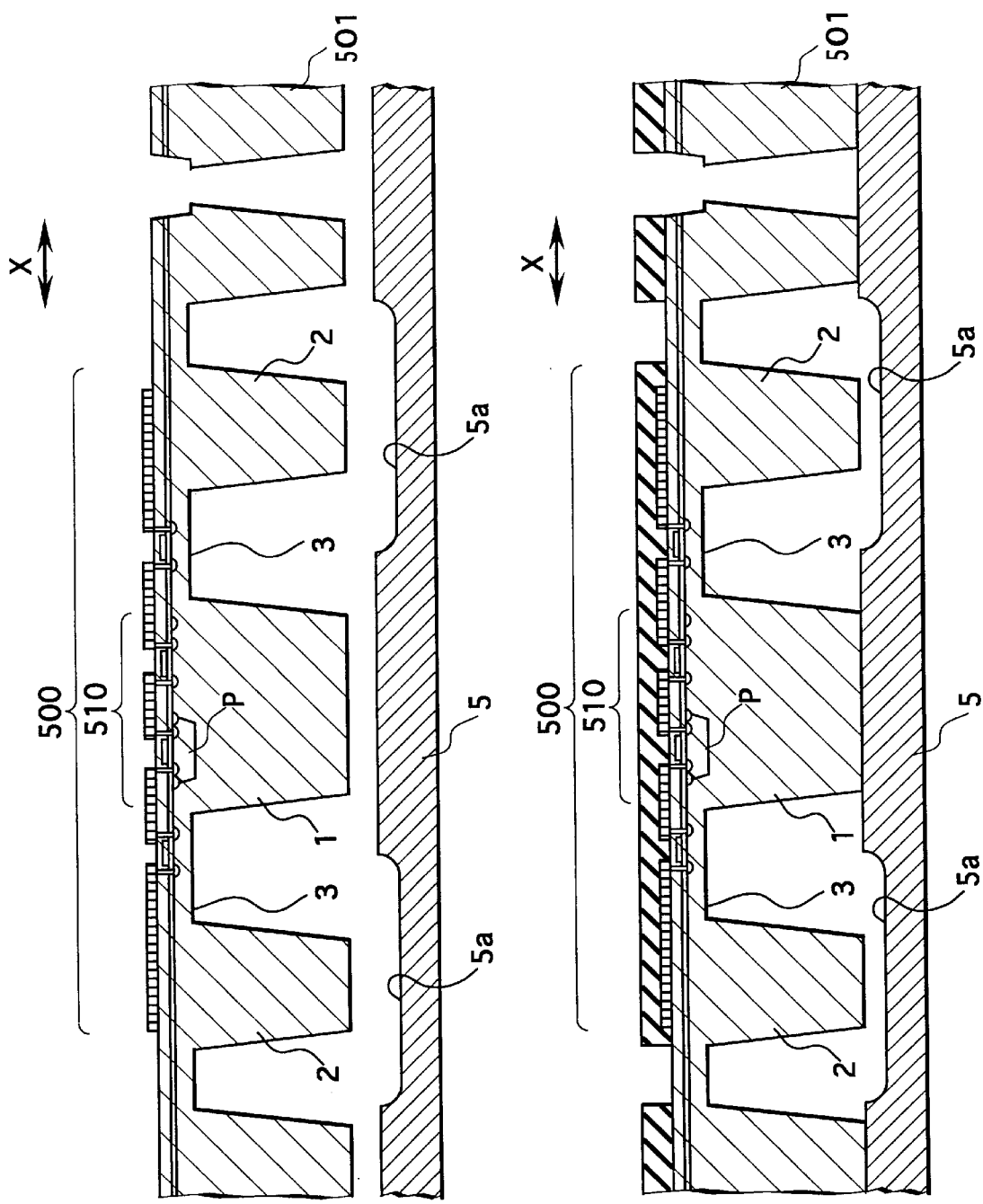
FIGS. 19A to 19C are process diagrams showing fabrication processes following the processes of FIGS. 18A to 18D.

In FIG. 19A, the coated film 504 on the top surface and the oxide film 505 on the bottom surface of the substrate are removed.

Further, a glass 5 for anode bonding is etched with a diluted hydrofluoric acid solution to form a movable air gap portion 5a corresponding to a position of the seismic mass 2.

In FIG. 19B, the bottom surface of the support base 1 of the silicon substrate 501 is bonded to the glass 5 by means of the anode bonding.

Figure 19C:
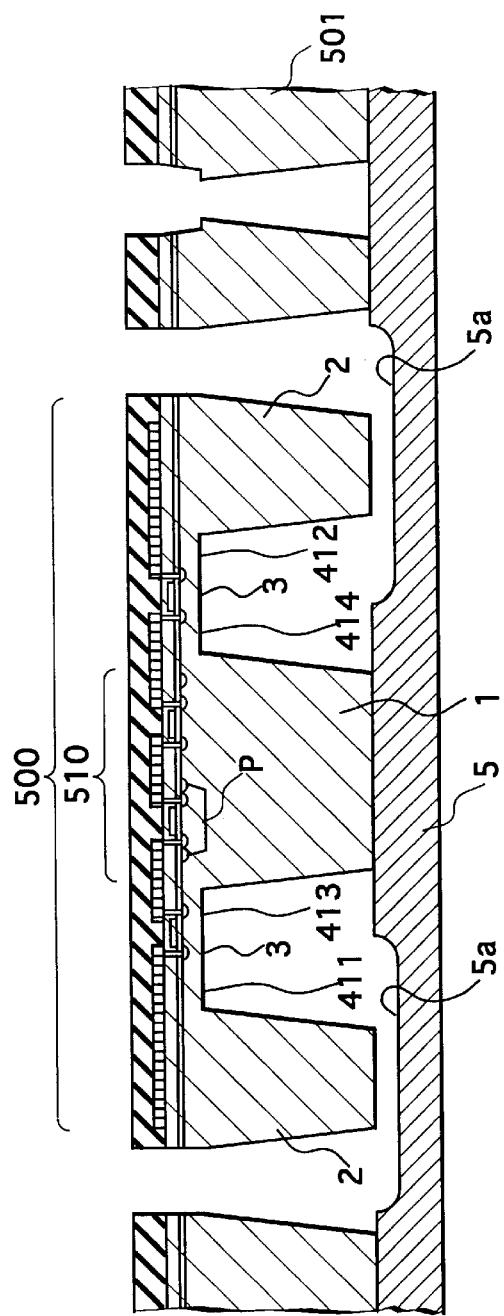

In FIG. 19C, the unwanted area of the silicon having a 10 μm thickness is removed by reactive ion etching (RIE) to form the sensor portion. Therefore, an accelerometer having such a structure as shown in FIG. 5 can be fabricated.

As described above, the fabrication process can use the conventionally known CMOS LSI fabrication process without any modification, thus fabricating an inexpensive sensor with suppressing fabrication cost.

Next, an another example of the accelerometer will be described referring to FIG. 20.

Figure 20:
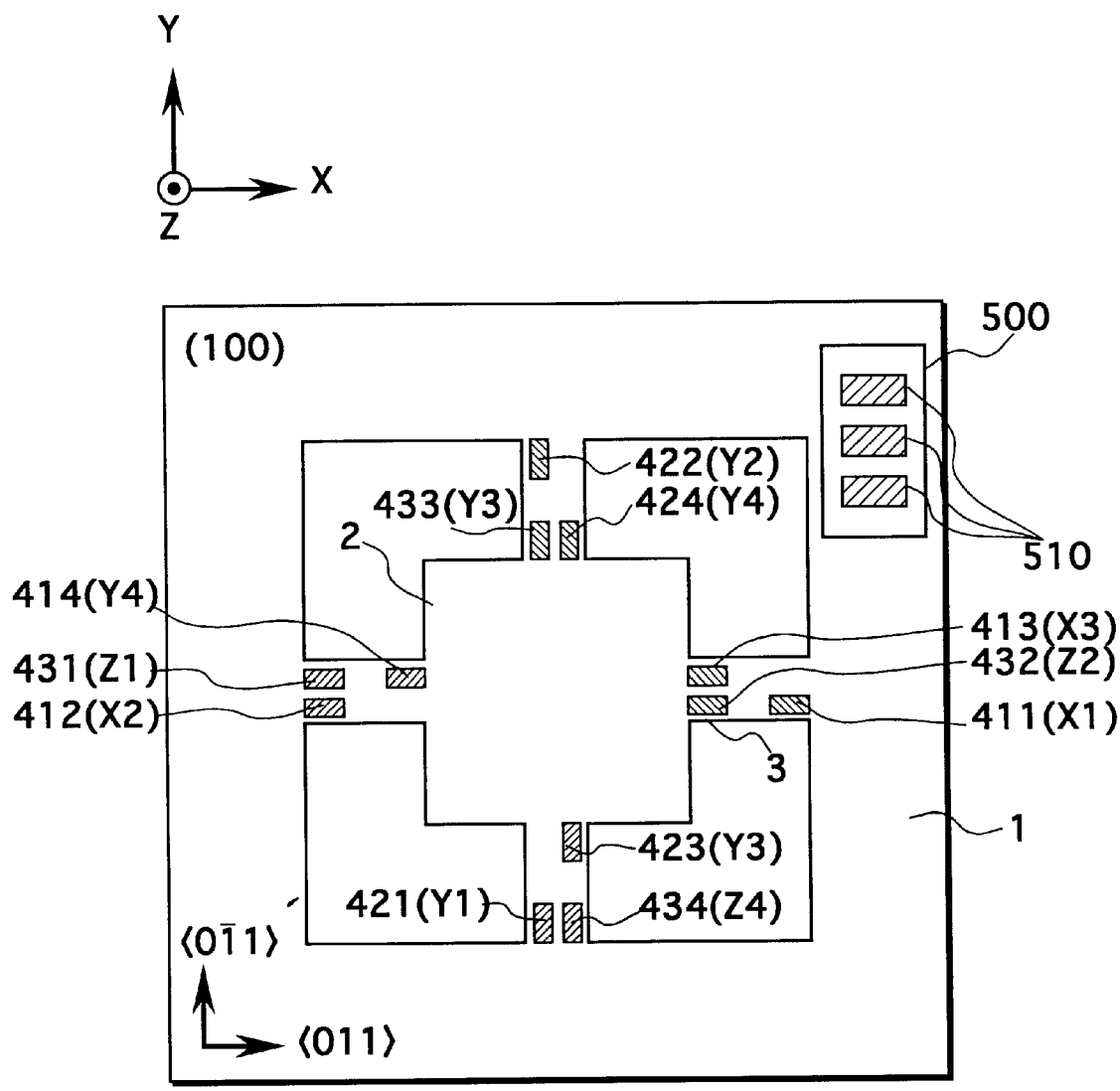
FIG. 20 is a top view showing an another example of the accelerometer.

FIG. 20 shows a structure wherein a seismic mass is surrounded by support 1. pMOS transistors 411–434 are arranged on beams 3 in respective directions (X, Y, Z). In this example, the acceleration component in each axis direction can be detected by using a differential amplifier circuit similar to that of FIG. 8.

As described above, according to the present invention, the stress is detected through electric amplification by using a plurality of strain detecting elements having amplifying function arranged on the beams, so that the output signal level can be increased and the detection sensitivity can be enhanced compared to the bridge circuits with the use of conventional diffusion resistance.

Moreover, a load of the amplifier circuits can be reduced, and therefore the power consumption can be suppressed.

Further, according to the present invention, the acceleration component in the sensitive axis (i.e. detection axis) direction is outputted as a differential mode and the acceleration component in the other axis directions are outputted as a common mode by using the differential amplifier circuits, thereby largely enhancing the sensitivity ratio between the detection axis sensitivity and the other axis sensitivities.

In addition, according to the present invention, the differentially amplified signals are used, so that the offset voltage and the other axis sensitivities can be suppressed to a low level regardless of fluctuation in the fabrication conditions.

What is claimed is:

1. A silicon integrated accelerometer comprising a fixed support base, a movable seismic mass, and beams having a thin thickness connecting said support base and said seismic mass, capable of measuring acceleration by detecting mechanical stresses based on bending of said beams, said accelerometer comprising:

a plurality of strain detecting elements arranged on said beams, composed of MOS (metal oxide semiconductor) transistors, for detecting said mechanical stresses; and a differential amplifier circuit, provided with a differential amplifying function, said circuit producing an output signal proportional to a differential signal due to said mechanical stresses obtained from a pair of said strain detecting elements;

wherein said MOS transistors according to said pair of strain detecting elements are structured as a part of a source coupling circuit, wherein said pair of strain detecting elements is operated in saturation region so that said output signal is amplified when said pair of strain detecting elements detect said mechanical stresses as a differential mode according to a home axis direction component to which the stress is applied and so that said output signal is reduced to zero when said pair of strain detecting elements detect said mechanical stresses as a common mode according to other axis direction components to which the stress is applied.

2. A silicon integrated accelerometer as claimed in claim 1, wherein stress concentration portions of said beams are a boundary portion on said beams connected to at least one of said support base and said seismic mass.

3. A silicon integrated accelerometer as claimed in claim 2, wherein said strain detecting elements are located at said stress concentration portions.

4. A silicon integrated accelerometer as claimed in claim 1, wherein said support base and said seismic mass, and said beams are structured by using (100)-oriented silicon single crystal substrate and said beams are arranged in a direction parallel to the crystallographic axis <011>.

5. A silicon integrated accelerometer as claimed in claim 1, wherein said seismic mass surrounds said support base.

6. A silicon integrated accelerometer as claimed in claim 1, wherein
   at least one of said beams is arranged at each of both sides of either said support base or said seismic mass, and
   said differential amplifier circuit is structured by arranging two strain detecting elements at the boundary portions between each said beam and said support base.

7. A silicon integrated accelerometer as claimed in claim 1, wherein
   at least one of said beams is arranged at each of both sides of either said support base or said seismic mass, and
   said differential amplifier circuit is structured by arranging two strain detecting elements at the boundary portions between each said beam and said seismic mass.

8. A silicon integrated accelerometer as claimed in claim 1, wherein
   at least one of said beams is arranged at each of both sides of either said support base or said seismic mass, and
   said differential amplifier circuit is structured by arranging one strain detecting element at the boundary portion between each said beam and said support base and by arranging one strain detecting element at the boundary portion between each said beam and said seismic mass.

9. A silicon integrated accelerometer as claimed in claim 1, further comprising:
   two current sources for driving two pairs of the differential amplifier circuits detecting an acceleration component in a uni-axial direction, and
   a switch for switching of said two current sources at high frequency.

* * * * *

UNITED STATES PATENT AND TRADEMARK OFFICE
CERTIFICATE OF CORRECTION

PATENT NO. : 6,683,358 B1
DATED : January 27, 2004
INVENTOR(S) : Makoto Ishida et al.

It is certified that error appears in the above-identified patent and that said Letters Patent is hereby corrected as shown below:

<u>Title page,</u>
Item [73], Assignee, please add -- Makoto Ishida --.

Signed and Sealed this

Twenty-second Day of November, 2005

JON W. DUDAS
*Director of the United States Patent and Trademark Office*